US006599813B2

(12) United States Patent
Beyer et al.

(10) Patent No.: US 6,599,813 B2
(45) Date of Patent: Jul. 29, 2003

(54) METHOD OF FORMING SHALLOW TRENCH ISOLATION FOR THIN SILICON-ON-INSULATOR SUBSTRATES

(75) Inventors: Klaus Beyer, Poughkeepsie, NY (US); Dominic Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/895,680

(22) Filed: Jun. 29, 2001

(65) Prior Publication Data
US 2003/0003678 A1 Jan. 2, 2003

(51) Int. Cl.[7] .................. H01L 21/76; H01L 21/00; H01L 21/336; H01L 21/3205; H01L 21/302
(52) U.S. Cl. ............... 438/424; 438/155; 438/259; 438/588; 438/692
(58) Field of Search ................ 438/588, 404, 438/424, 692, 259, 155, 425, 426, 427

(56) References Cited

U.S. PATENT DOCUMENTS

| 4,692,992 | A |   | 9/1987  | Hsu |         |
|-----------|---|---|---------|-----|---------|
| 4,806,501 | A |   | 2/1989  | Baldi et al. | |
| 4,881,105 | A |   | 11/1989 | Davari et al. | |
| 5,177,028 | A | * | 1/1993  | Manning | 438/289 |
| 5,466,617 | A | * | 11/1995 | Shannon | 438/155 |
| 5,534,450 | A |   | 7/1996  | Kim | |
| 5,731,241 | A |   | 3/1998  | Jang et al. | |
| 5,770,484 | A | * | 6/1998  | Kleinhenz | 438/155 |
| 5,837,612 | A | * | 11/1998 | Ajuria et al. | 438/697 |
| 5,851,900 | A |   | 12/1998 | Chu et al. | |
| 5,854,120 | A | * | 12/1998 | Urano et al. | 438/404 |
| 5,874,328 | A |   | 2/1999  | Liu et al. | |
| 5,882,969 | A | * | 3/1999  | Krautschneider et al. | 438/259 |
| 5,937,286 | A |   | 8/1999  | Abiko | |
| 5,956,583 | A |   | 9/1999  | Fuller | |
| 5,963,818 | A | * | 10/1999 | Kao et al. | 438/424 |
| 5,994,178 | A |   | 11/1999 | Wu | |
| 5,998,261 | A | * | 12/1999 | Hofmann et al. | 438/257 |
| 6,001,706 | A | * | 12/1999 | Tan et al. | 438/424 |
| 6,008,095 | A |   | 12/1999 | Gardner et al. | |
| 6,060,748 | A |   | 5/2000  | Uchida et al. | |
| 6,073,004 | A |   | 6/2000  | Balachandran | |
| 6,074,904 | A |   | 6/2000  | Spikes, Jr. et al. | |
| 6,076,028 | A |   | 6/2000  | Donnelly et al. | |
| 6,087,233 | A |   | 7/2000  | Roh | |
| 6,110,788 | A | * | 8/2000  | Violette et al. | 438/301 |
| 6,133,610 | A | * | 10/2000 | Bolam et al. | 257/349 |
| 6,144,086 | A |   | 11/2000 | Brown et al. | |
| 6,146,970 | A | * | 11/2000 | Witek et al. | 438/424 |
| 6,153,918 | A |   | 11/2000 | Kawashima et al. | |
| 6,281,095 | B1 | * | 8/2001  | Bolam et al. | 438/462 |
| 6,323,125 | B1 | * | 11/2001 | Soo et al. | 438/645 |
| 6,333,232 | B1 | * | 12/2001 | Kunikiyo | 438/296 |
| 6,361,415 | B1 | * | 3/2002  | Sethuraman et al. | 451/60 |
| 6,380,599 | B1 | * | 4/2002  | Fazan et al. | 257/396 |

FOREIGN PATENT DOCUMENTS

| JP | 406267985 A | * | 9/1994 |
| TW | 86116978 |   | 11/1986 |

* cited by examiner

Primary Examiner—Matthew Smith
Assistant Examiner—Chuong A Luu
(74) Attorney, Agent, or Firm—Margaret A. Pepper

(57) ABSTRACT

A method is disclosed for forming shallow trench isolation (STI) on a thin silicon-on-insulator (SOI) substrate. The method comprises depositing a first polysilicon layer; depositing a polish stop layer on the first polysilicon layer; forming a plurality of trenches in the substrate; filling the trenches with silicon oxide; CMP polishing a first portion of the silicon oxide layer down to the polish stop layer; etching a second portion of the silicon oxide layer down to below the polish stop layer and above the first polysilicon layer; removing the polish stop layer; depositing a second polysilicon layer; and forming a polysilicon gate comprised of the first and second polysilicon layers. Well ion implants may be performed prior to gate formation, thereby preventing exposure of STI oxide to sacrificial oxide growth and removal, eliminating excessive recess in STI structures. STI oxide seam leakage due to polysilicon sidewalls remaining after polysilicon gate etch are also avoided.

36 Claims, 6 Drawing Sheets

METHOD OF FORMING SHALLOW TRENCH ISOLATION FOR THIN SILICON-ON-INSULATOR SUBSTRATES

FIELD OF THE INVENTION

The present invention relates generally to the manufacture of semiconductor devices, and more particularly to a method of forming shallow trench isolation (STI) for semiconductor integrated circuits on thin silicon-on-insulator (SOI) substrates.

BACKGROUND OF THE INVENTION

In the formation of semiconductor integrated circuits, it is necessary to isolate discrete semiconductor devices such as field effect transistors (FETs) using various field oxide isolations. In advanced semiconductor integrated circuit schemes, shallow trenches are often used in a silicon substrate, to minimize the field oxide feature size. Such trenches are filled with silicon dioxide ($SiO_2$), typically by chemical vapor deposition (CVD). Excess $SiO_2$ is then removed either by etching or chemical mechanical polishing (CMP) to form the field oxide isolation, which is commonly referred to as shallow trench isolation (STI).

However, there are several problems associated with applying current STI formation processes to silicon-on-insulator (SOI) substrates, requiring STI oxide fill of very shallow depths below 1000 Å. For example, relatively large variations in STI oxide thickness can occur due to erosion of the STI oxide during oxide etches in current STI formation processes, such as pad oxide and sacrificial oxide stripping steps, as explained below.

A typical STI formation process begins with formation of a pad oxide layer on top of the silicon substrate, followed by deposition of a polish stop layer such as silicon nitride. Next, a trench is formed in the polish stop layer, pad oxide layer and silicon substrate, using conventional photolithography masking and etching techniques. A sidewall oxide may be thermally grown on the silicon sidewalls of the trench, to reduce the field emission effect. Then, the trench is filled with $SiO_2$ by, for example, a high density plasma (HDP) deposition process. Excess $SiO_2$ is removed by CMP planarization down to the polish stop layer, and the polish stop layer is then removed.

Next, well ion implants are performed. Before implant, the previously grown pad oxide layer is removed by etching. During etching, some of the STI oxide fill is also inevitably removed. Next, a sacrificial oxide layer is grown on the silicon substrate. Then, well ion implants are performed. Ion implant of the $SiO_2$ STI fill is believed to cause the surface of the $SiO_2$ to become very soft. Upon stripping of the sacrificial oxide layer, a significant amount of the softened $SiO_2$ STI fill material is also removed. Removal of $SiO_2$ STI fill material during removal of pad oxide and sacrificial oxide layers not only causes relatively large variations in STI oxide thickness, but also creates divots between the STI and the silicon substrate.

Following well ion implant, the polysilicon gate is formed as follows. First, a layer of polysilicon is deposited over the substrate surface. Then, a gate is defined in the polysilicon layer by conventional photolithography masking and etching techniques. However, polysilicon rails often remain on the sidewalls of the divots created between the STI and the silicon substrate. These rails may cause electrical shorts between gates, thereby affecting integrated circuit yield and reliability.

These problems are of increasing concern as integrated circuit feature size becomes smaller and device density becomes larger. In addition, these problems are of particular concern with regard to STI formed by conventional processes on SOI substrates. SOI substrates are comprised of a thin silicon layer on top of a buried oxide layer. The thin silicon layer typically has a thickness of less than 1000 Å, and more usually about 500 Å. The buried oxide layer typically has a thickness of about 1000 Å to 1500 Å. STI thickness control and divot elimination have not been achievable using convention STI formation processes with SOI substrates.

SUMMARY OF THE INVENTION

The aforementioned problems are addressed by the method of the present invention. In accordance with the present invention, a method is disclosed for forming shallow trench isolation (STI) on a silicon-on-insulator (SOI) substrate, wherein said SOI substrate comprises a silicon layer on top of a buried oxide layer. The method comprises the steps of: forming a gate oxide layer on said silicon layer; depositing a first polysilicon layer on said gate oxide layer; depositing a polish stop layer on said first polysilicon layer; forming a plurality of trenches in said substrate, wherein said trenches have a depth extending through said polish stop layer, said first polysilicon layer, said gate oxide layer, and said silicon layer; conformally depositing a silicon oxide layer in said trenches and on said polish stop layer; removing a first portion of said silicon oxide layer by chemical mechanical polishing, such that the top surface of said silicon oxide layer in said trenches is polished down to the same height as the top surface of said polish stop layer; removing a second portion of said silicon oxide layer by etching, such that the top surface of said silicon oxide layer is etched down to a height below the top surface of said polish stop layer and above the top surface of said first polysilicon layer; removing said polish stop layer; depositing a second polysilicon layer on said silicon oxide layer and said first polysilicon layer; and forming a polysilicon gate comprised of said first and second polysilicon layers by photolithography masking and anisotropic etching said first and second polysilicon layers.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION

The improved method of the present invention for forming STI on SOI substrates is now described in detail. As discussed previously, conventional STI formation processes, as applied to SOI substrates, suffer from poor process control causing relatively large variations in STI oxide thickness as well as the creation of divots between the STI and the silicon substrate. This is believed to be caused, at least in part, by softening of the $SiO_2$ STI fill material during well ion implants. In the present invention, this suspected cause is eliminated by performing all well implants prior to STI formation.

A preferred embodiment of the present invention will now be described. The preferred method may begin with growth of a sacrificial oxide layer on an SOI substrate according to conventional techniques. Alignment marks may be introduced, and all suitable well and threshold ion implantations are implemented. Following well ion implant, the sacrificial oxide layer should be removed prior to continuing with the method of the present invention.

Figure 1:
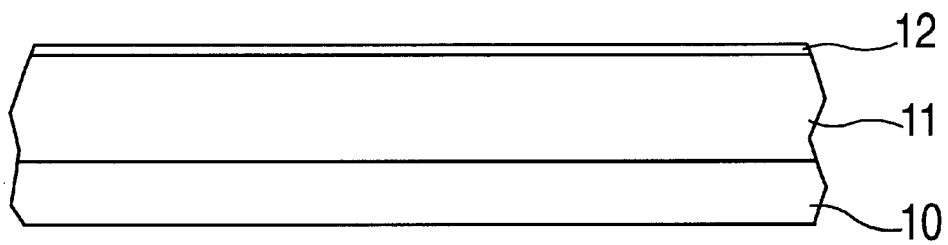
FIGS. 1–11 illustrate a preferred method of the present invention showing cross-sectional views of a partially fabricated semiconductor STI device structure.

FIGS. 1–11 illustrate the remaining steps of a preferred method of the present invention. In FIG. 1, the method continues with the formation of a thin gate oxide layer 12 on top of SOI substrate comprising silicon layer 11 and buried oxide layer 10. SOI substrates typically comprise three layers: a top silicon layer such as silicon layer 11, a buried oxide layer such as buried oxide layer 10, and a bulk silicon layer (not shown). The thickness of silicon layer 11 is typically less than 1000 Å, more usually about 500 Å. Buried oxide layer 10 typically has a thickness of about 1000 Å to about 1500 Å, more usually about 1350 Å to about 1450 Å.

Gate oxide layer 12 may be grown on silicon layer 11 by any suitable method, such as by thermal oxidation in oxygen and/or nitrous oxide, preferably by exposing the substrate to a dry atmosphere of oxygen and nitrous oxide in an oxidation furnace at a temperature of between about 650° C. and about 850° C. for a time of about 5 min. to about 30 min. Gate oxide layer 12 is formed on the substrate surface, and is preferably grown to a thickness of about 10 Å to about 30 Å.

Figure 2:
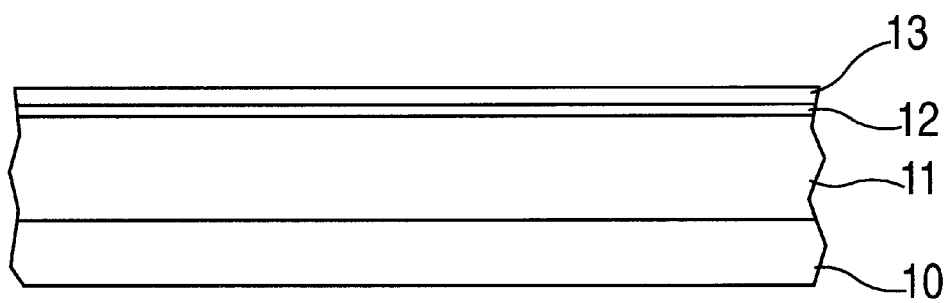

In the next step, shown in FIG. 2, a first polysilicon layer 13 is deposited on gate oxide layer 12. First polysilicon layer 13 may be deposited by any suitable method, such as by low pressure chemical vapor deposition (LPCVD) using a reactant gas such as silane ($SiH_4$), at a temperature of between about 700° C. and about 800° C. First polysilicon layer 13 should be deposited to a thickness of about 300 Å to about 600 Å, preferably about 500 Å.

Figure 3:
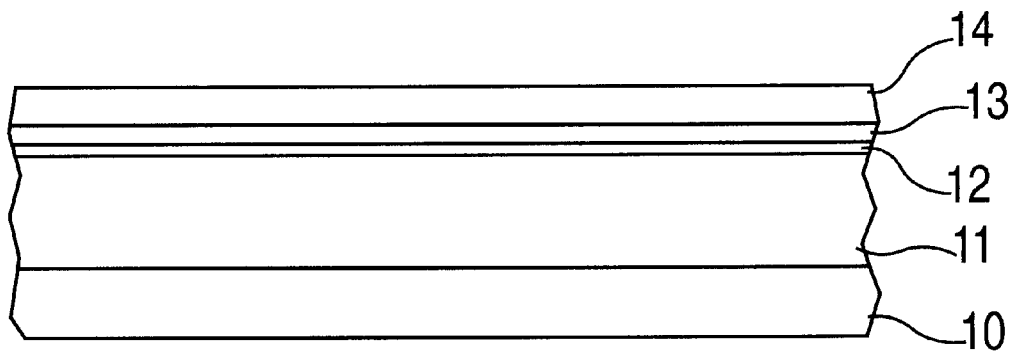

Next, as shown in FIG. 3, a polish stop layer 14 is deposited on first polysilicon layer 13. Polish stop layer 14 may be formed of any material suitable for acting as a polishing stop layer for a subsequent chemical mechanical polishing (CMP) step. Preferably, polish stop layer 14 is composed of silicon nitride ($Si_3N_4$), which may be deposited by LPCVD using a reactant gas mixture such as silane ($SiH_4$) and ammonia ($NH_3$), at a temperature of between about 700° C. and 800° C. Polish stop layer 14 should be deposited to a thickness sufficient to act as a polishing stop layer, such as a thickness of about 500 Å to about 1000 Å, preferably about 800 Å.

Figure 4:
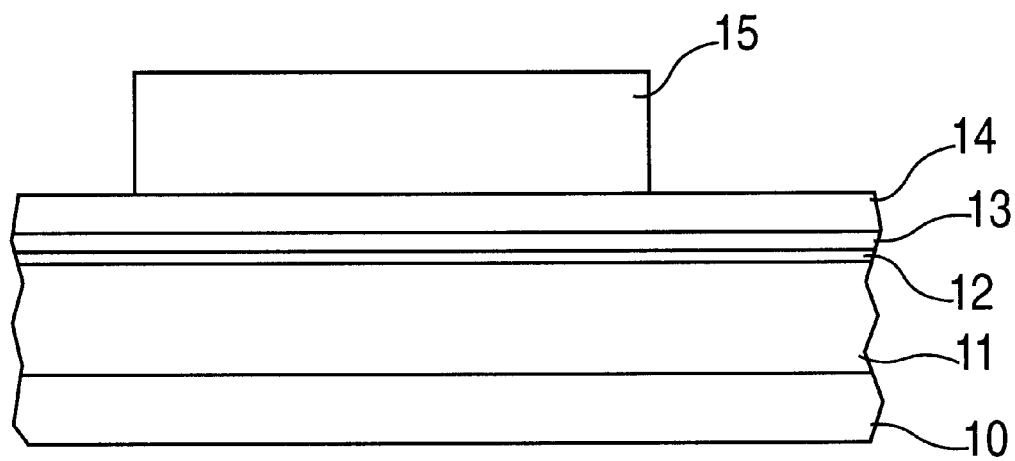
Figure 5:
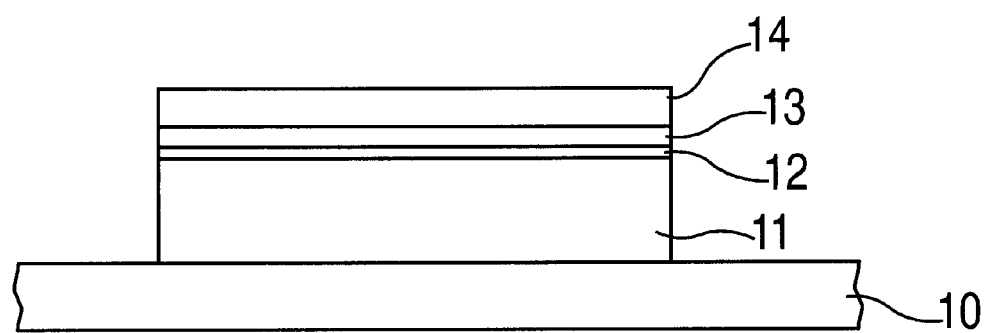

FIGS. 4 and 5 show the formation of the STI trenches. In FIG. 4, photoresist mask 15 is patterned over the substrate by conventional photolithography techniques. In FIG. 5, exposed areas of polish stop layer 14, first polysilicon layer 13, gate oxide layer 12, and thin silicon layer 11 are etched by a selective anisotropic etching process, such as reactive ion etching (RIE). Directional RIE is the preferred etching method in order to prevent etching into first polysilicon layer 13 from the side of the trench. Anisotropic etching, as opposed to plasma etching, is preferred in order to provide good control over trench depth. The preferred etchant gases are as follows: $NF_3$/Ar for silicon nitride polish stop layer 14; HBr/$Cl_2$ for first polysilicon layer 13; $NF_3$/Ar for gate oxide layer 12; and HBr/$Cl_2$ for thin silicon layer 11. The trench typically has a depth of about 1700 Å to about 2200 Å, preferably about 1850 Å.

Figure 6:
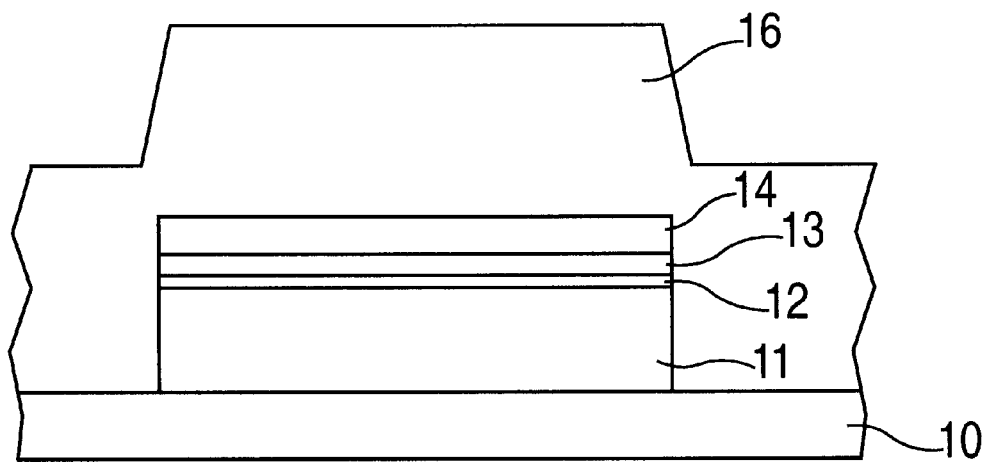

After forming STI trenches, the STI trench fill is performed. Prior to filling STI trenches, an oxide liner may be thermally grown on the exposed silicon and polysilicon surfaces in each trench. The oxide liner (not shown) may have a thickness of about 50 Å to about 300 Å, preferably about 100 Å. Next, $SiO_2$ is deposited on the substrate in a thickness sufficient to completely fill the STI trenches, as shown in FIG. 6 as STI oxide layer 16. STI $SiO_2$ may be deposited using High Density Plasma (HDP) deposition techniques, or using LPCVD and a reactant gas such as tetraethylorthosilicate oxide (TEOS). STI oxide layer 16 should be deposited to a thickness slightly greater than the trench depth, typically to a thickness of about 1800 Å to about 2400 Å.

Figure 7:
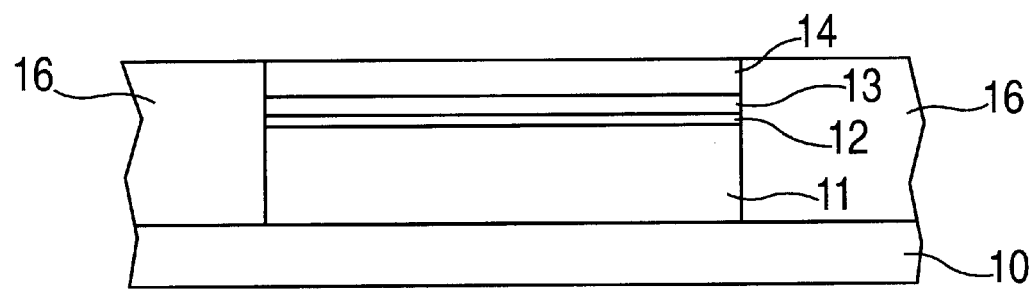

Following STI fill, excess STI oxide 16 is removed by CMP planarization down to the top surface of polish stop layer 14, as shown in FIG. 7. Any appropriate polishing tool and slurry can be used for this CMP step. It has been found that a very well defined planar level may be produced using a cerium oxide ($CeO_2$)-based slurry combined with a surfactant, such as that described in U.S. Pat. No. 5,876,490, and in copending U.S. patent application Ser. No. 09/577,347, the disclosures of which are hereby incorporated by reference. By using a $CeO_2$-based slurry with surfactant, STI oxide 16 is polished down only to the top surface of polish stop layer 14, but no lower. In other words, no dishing of the STI oxide occurs.

Figure 8:
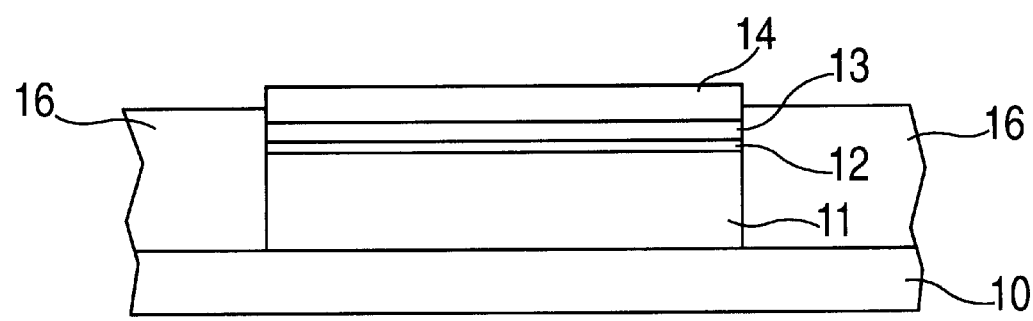
Figure 9:
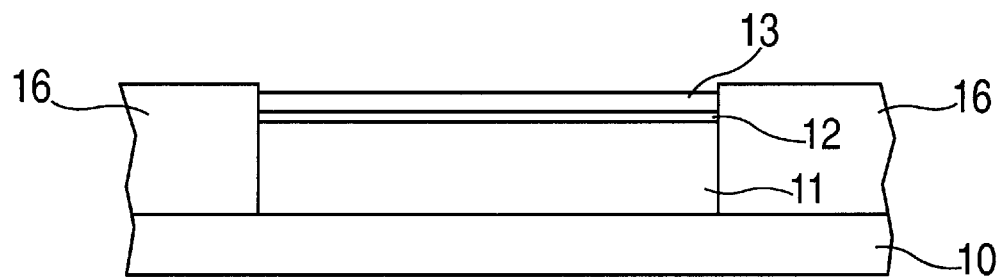

Next, an additional amount of STI oxide 16 is removed, as shown in FIG. 8, in order to bring the top surface of STI oxide 16 near the top surface of first polysilicon layer 13. Such removal is accomplished by an appropriate etching process, such as a timed wet etching or RIE process. A timed wet etch is a simpler etch back process than a RIE process, and is therefore preferred. A sufficient thickness of STI oxide 16 is removed such that the top surface of the etched STI oxide 16 is approximately near the top surface of first polysilicon layer 13. Preferably, STI oxide 16 removal should be limited such that the top surface of the etched STI oxide 16 is at least about 200 Å higher than the top surface of silicon layer 11, in order to avoid gate corner leakage. On the other hand, a sufficient portion of STI oxide should be removed such that the top surface of the etched STI oxide 16 is no more than about 200 Å higher than the top surface of first polysilicon layer 13, in order to avoid STI oxide seam leakage due to polysilicon sidewalls or rails remaining after polysilicon gate etch. For example, if first polysilicon layer 13 has a thickness of about 500 Å, then the top surface of the etched STI oxide 16 should be no more than about 700 Å higher than the top surface of silicon layer 11. As another example, if first polysilicon layer 13 has a thickness of about 1000 Å, then the top surface of the etched STI oxide 16 should be no more than about 1200 Å higher than the top surface of silicon layer 11. After STI oxide 16 is etched back to an appropriate thickness, polish stop layer 14 can be removed by a selective RIE process, as shown in FIG. 9.

Figure 10:
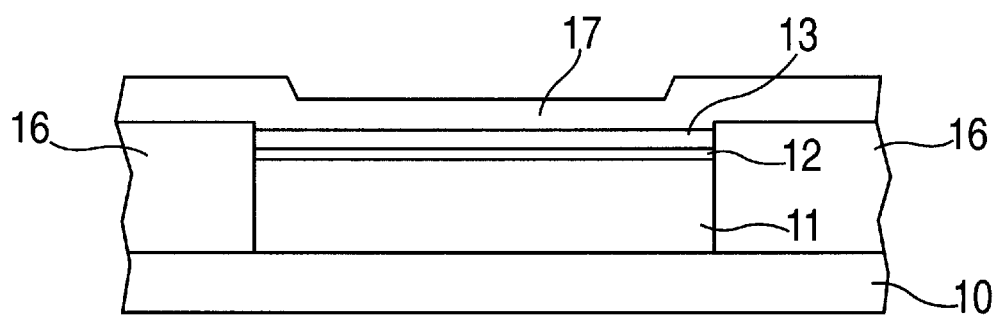

After removal of polish stop layer 14, a second polysilicon layer 17 is deposited on the STI device structure, as shown in FIG. 10. Second polysilicon layer 17 may be deposited by any suitable method, such as by low pressure chemical vapor deposition (LPCVD) using a reactant gas such as silane ($SiH_4$), at a temperature of between about 700° C. and about 800° C. Second polysilicon layer 17 is deposited in a thickness of about 750 Å to about 1500 Å, preferably about 1000 Å. Optionally, an oxide layer (not shown) may be deposited over second polysilicon layer 17, using plasma-enhanced LPCVD, to a thickness of about 500 Å.

Figure 11:
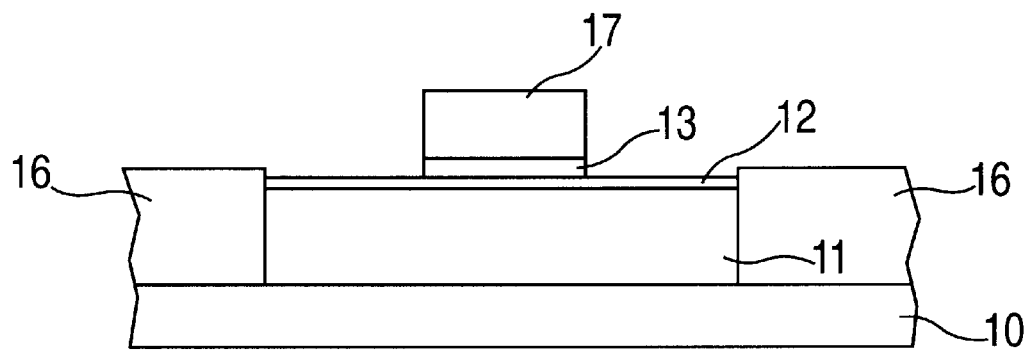

In the final step, shown in FIG. 11, the gate is formed by conventional photolithography masking and etching techniques. Specifically, a photoresist mask (not shown) is formed over second polysilicon layer 17 to define the gate area, and exposed portions of polysilicon layers 13 and 17 are removed by an appropriate anisotropic etching technique such as RIE, leaving a gate structure comprised of polysilicon layers 13 and 17 as shown.

Figure 12:
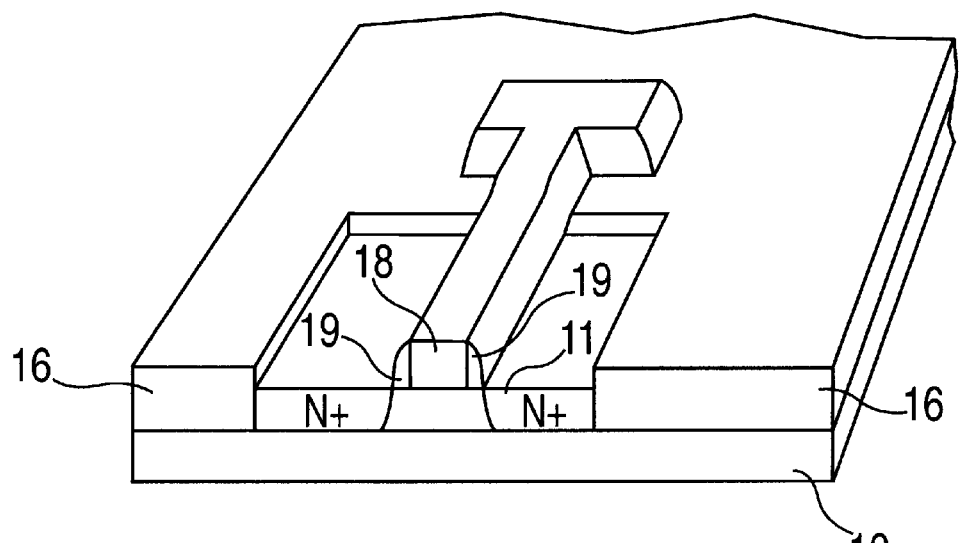
FIG. 12 shows a perspective view of a STI device structure fabricated according to the method of the present invention.

Conventional CMOS processing continues thereafter, to form complementary CMOS devices or bipolar devices surrounded by a nearly planar STI structure, as shown in FIG. 12. Gate 18, comprised of first and second polysilicon layers, is shown with a sidewall oxide layer 19.

The method of the present invention provides an advantage over prior art methods in that the STI oxide is not exposed to sacrificial oxide growth and removal for well ion implants, which may cause excessive recess in STI structures built using prior art methods. Moreover, the present method provides far greater process control which is necessary when forming STI on thin SOI substrates. STI oxide seam leakage due to polysilicon sidewalls formed after polysilicon gate etch can be avoided, and gate corner leakage can be eliminated, by precisely controlling the height of the first polysilicon layer using the method of the present invention.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A method for forming shallow trench isolation on a silicon-on-insulator (SOI) substrate for isolating device areas on said SOI substrate, wherein said SOI substrate comprises a silicon layer on top of a buried oxide layer, the method comprising the steps of:
   forming a gate oxide layer on said silicon layer;
   depositing a first polysilicon layer on said gate oxide layer;
   depositing a polish stop layer on said first polysilicon layer;
   forming a plurality of trenches, wherein said trenches have a depth extending through said polish stop layer, said first polysilicon layer, said gate oxide layer, and said silicon layer;
   conformally depositing a silicon oxide layer in said trenches and on said polish stop layer;
   removing a first portion of said silicon oxide layer by chemical mechanical polishing, such that the top surface of said silicon oxide layer in said trenches is polished down to the same height as the top surface of said polish stop layer;
   removing a second portion of said silicon oxide layer by etching, such that the top surface of said silicon oxide layer is etched down to a height below the top surface of said polish stop layer and above the top surface of said first polysilicon layer;
   removing said polish stop layer;
   depositing a second polysilicon layer on said silicon oxide layer and said first polysilicon layer; and
   forming a polysilicon gate comprised of said first and second polysilicon layers by photolithography masking and etching said first and second polysilicon layers.

2. The method of claim 1 wherein said silicon layer has a thickness of less than about 1000 Å.

3. The method of claim 1 wherein said silicon layer has a thickness of less than about 500 Å.

4. The method of claim 1 wherein said gate oxide layer is formed by thermal oxidation in an atmosphere comprising a gas selected from the group consisting of oxygen and nitrous oxide.

5. The method of claim 1 wherein said gate oxide layer has a thickness of about 10 Å to about 30 Å.

6. The method of claim 1 wherein said first polysilicon layer is deposited by low pressure chemical vapor deposition using silane.

7. The method of claim 1 wherein said first polysilicon layer has a thickness of about 300 Å to about 600 Å.

8. The method of claim 1 wherein said first polysilicon layer has a thickness of about 500 Å.

9. The method of claim 1 wherein said polish stop layer comprises silicon nitride.

10. The method of claim 1 wherein said polish stop layer is deposited by low pressure chemical vapor deposition using silane and ammonia.

11. The method of claim 1 wherein said polish stop layer has a thickness of about 500 Å to about 1000 Å.

12. The method of claim 1 wherein said polish stop layer has a thickness of about 800 Å.

13. The method of claim 1 wherein said trenches are formed by photolithography masking and anisotropic etching.

14. The method of claim 13 wherein said anisotropic etching comprises directional reactive ion etching.

15. The method of claim 1 wherein said trenches have a depth of about 1700 Å to about 2200 Å.

16. The method of claim 1 further comprising forming an oxide liner in said trenches prior to depositing said silicon oxide layer.

17. The method of claim 16 wherein said oxide liner is formed by thermal oxidation in an oxygen atmosphere.

18. The method of claim 16 wherein said oxide liner has a thickness of about 50 Å to about 300 Å.

19. The method of claim 16 wherein said oxide liner has a thickness of about 100 Å.

20. The method of claim 1 wherein said silicon oxide layer is deposited by a high density plasma process.

21. The method of claim 1 wherein said silicon oxide layer is deposited by low pressure chemical vapor deposition using tetraethylorthosilicate oxide.

22. The method of claim 1 wherein said silicon oxide layer has a thickness greater than said trench depth.

23. The method of claim 1 wherein said silicon oxide layer has a thickness of about 1800 Å to about 2400 Å.

24. The method of claim 1 wherein said first portion of said silicon oxide layer is removed by chemical mechanical polishing using a slurry comprising cerium oxide and a surfactant.

25. The method of claim 1 wherein said second portion of said silicon oxide layer is removed by a wet etching process.

26. The method of claim 1 wherein said second portion of said silicon oxide layer is removed by a reactive ion etching process.

27. The method of claim 1 wherein said second portion of said silicon oxide layer is removed such that the top surface of said silicon oxide layer is at least about 200 Å higher than the top surface of said silicon layer, and the top surface of said silicon oxide layer is no more than about 200 Å higher than the top surface of said first polysilicon layer.

28. The method of claim 1 wherein said polish stop layer is removed by a selective reactive ion etching process.

29. The method of claim 1 wherein said second polysilicon layer is deposited by low pressure chemical vapor deposition using silane.

30. The method of claim 1 wherein said second polysilicon layer has a thickness of about 750 Å to about 1500 Å.

31. The method of claim 1 wherein said second polysilicon layer has a thickness of about 1000 Å.

32. The method of claim 1 further comprising the step of depositing an oxide layer on said second polysilicon layer prior to forming said polysilicon gate.

33. The method of claim 32 wherein said oxide layer is deposited by plasma-enhanced low pressure chemical vapor deposition.

34. The method of claim 32 wherein said oxide layer has a thickness of about 500 Å.

35. The method of claim 1 wherein said polysilicon gate is formed by photolithography masking and reactive ion etching.

36. The method of claims 1 further comprising, prior to forming said gate oxide layer on said silicon layer, the steps of:

forming a sacrificial oxide layer on said silicon layer;

performing threshold ion implantations and source/drain well implantations through said sacrificial oxide layer; and removing said sacrificial oxide layer.

* * * * *